United States Patent
Boos

(10) Patent No.: US 7,161,418 B2
(45) Date of Patent: Jan. 9, 2007

(54) AMPLIFIER ARRANGEMENT AND METHOD FOR CALIBRATING AN AMPLIFIER ARRANGEMENT

(75) Inventor: Zdravko Boos, München (DE)

(73) Assignee: Infineon Technologies AG, Munich (DE)

( * ) Notice: Subject to any disclaimer, the term of this patent is extended or adjusted under 35 U.S.C. 154(b) by 77 days.

(21) Appl. No.: 11/025,721

(22) Filed: Dec. 29, 2004

(65) Prior Publication Data

US 2005/0168277 A1 Aug. 4, 2005

(30) Foreign Application Priority Data

Dec. 30, 2003 (DE) .............................. 103 61 651

(51) Int. Cl.
*G01R 19/00* (2006.01)
(52) U.S. Cl. .............................. 330/2; 330/278; 330/98
(58) Field of Classification Search .................... 330/2, 330/278, 98
See application file for complete search history.

(56) References Cited

U.S. PATENT DOCUMENTS

| 6,480,061 B1 * | 11/2002 | Dolman et al. ................. 330/2 |
| 6,498,927 B1 * | 12/2002 | Kang et al. ............... 455/245.2 |
| 6,785,523 B1 * | 8/2004 | Husted et al. ............... 455/219 |
| 6,819,938 B1 * | 11/2004 | Sahota ........................ 455/522 |
| 2003/0139147 A1 | 7/2003 | Shi |
| 2003/0215033 A1 * | 11/2003 | Drapkin et al. ............. 375/345 |

FOREIGN PATENT DOCUMENTS

DE      101 63 466 A1      7/2003

* cited by examiner

*Primary Examiner*—Patricia Nguyen
(74) *Attorney, Agent, or Firm*—Eschweiler & Associates, LLC

(57) ABSTRACT

An amplifier arrangement is disclosed that includes at least two series-connected, programmable amplifiers. The amplifiers each have a different amplifier step size. In addition, a calibration path is provided which feeds back the output of the second programmable amplifier to the programming inputs of the first and/or second programmable amplifier. The calibration path includes an analog/digital converter and an evaluation and control element. It is thus possible to calibrate away less-than-ideal characteristics, particularly in the case of changes in the gain from one amplifier block to another. The proposed amplifier arrangement and the method for calibration are particularly suitable for use in transmission and reception paths in transceivers which operate continuously over time.

20 Claims, 4 Drawing Sheets

AMPLIFIER ARRANGEMENT AND METHOD FOR CALIBRATING AN AMPLIFIER ARRANGEMENT

REFERENCE TO RELATED APPLICATIONS

This application claims the benefit of the priority date of German application DE 103 61 651.9, filed on Dec. 30, 2003, the contents of which are herein incorporated by reference in their entirety.

FIELD OF THE INVENTION

The present invention relates to an amplifier arrangement, to the use of the amplifier arrangement in a transmission and/or reception arrangement and to a method for calibrating an amplifier arrangement.

BACKGROUND OF THE INVENTION

In radio reception and radio transmission arrangements, "AGCs" (Automatic Gain Control) are normally used to control the amplitude gain for the purpose of automatic gain control in the respective signal paths. Such AGCs use continuous control for the amplitude gain and are predominantly used, by way of example, in mobile radio transceivers which operate on the basis of the GSM (Global System for Mobile Communication) standard.

By contrast, the recently introduced third-generation mobile radios have greater demands on the gain range and on the accuracy of the gain setting. This is because these communication appliances use code division multiple access (CDMA), whereas previously time division multiple access (TDMA) or frequency division multiple access (FDMA) have normally been used. Since the modern mobile radio methods involve some of the information being transmitted in the modulation of the amplitude, much greater demands on the gain control arise overall. In addition, the AGC not only needs to be carried out with greater accuracy and with a larger setting range but also needs to be performed continuously both in the transmission mode and in the reception mode.

In transmission arrangements based on UMTS (Universal Mobile Telecommunications Standard), the maximum output power for a class 3 transmitter is specified as +24 dBmW and the minimum output power is specified as −50 dBmW, for example. Accordingly, the required power control range of the transmitter is at least 74 dB in magnitude. To these 74 dB, it is necessary to add the variation in the gain over the amplifier signal chain of at least 6 dB. It is accordingly necessary to be able to cover a minimum gain range of 80 dB in practice.

The specification also demands that it is necessary to adhere to the gain in stages of 1 dB with an accuracy of +/−0.5 dB for all temperatures, process tolerances and frequencies.

In addition, with respect to the lowest possible power consumption, provision should be made for the ten stages with the highest gain from the total of 80 amplifier stages to have an accuracy of 0.1 dB in preference. In a receiver based on UMTS, the input signal may assume any level between −99 dBm and −25 dBm, for example. This results in a gain range to be covered, including tolerance compensation, of at least 80 dB. Normally, this results in a gain of 20 dB in one stage from the input-side, low-noise amplifier (LNA), while in baseband the remaining 60 dB are covered in stages of 1 dB.

The document DE 101 63 466 A1 specifies a transmission arrangement for continuous-time data transmission where programmable amplifiers are provided in baseband and/or in the radio-frequency path of the signal processing chain for the purpose of signal amplification.

In contrast to the AGC, a programmable gain control (PGC) is understood in the present instance to be adjustable in discrete steps of the amplitude gain.

Transceiver architectures which meet multi-system, multi-frequency-band and multi-mode requirements and can be integrated on a large scale are normally designed as transmitters with a direct-conversion architecture and receivers with a direct-conversion architecture. The fact that such transceivers do not perform any intermediate-frequency processing means that it is necessary to distribute the gain control over the baseband signal processing and the radio-frequency signal processing.

In UMTS systems, baseband covers a frequency range from 0 Hz to 1.92 MHz, for example. The radio-frequency range in the case of UMTS systems means a frequency band from 1920 to 1980 MHz in the transmitter and from 2110 to 2170 MHz in the receiver, for example.

At present, continuous gain control (AGC) is preferably used in transmission arrangements based on code-division multiple access, in order to meet the requirements regarding error vector magnitude (EVM) and the transmission-spectrum mask over the entire dynamic range. In addition, the gain control cannot respectively be effected before the actual transmission timeslots, as in the case of time-division multiple access systems, but rather needs to be performed during the continuous user-data transmission.

Although the programmable gain control (PGC) affords advantages with respect to lower power consumption, smaller chip area, reduced number of pins, greater robustness toward radiated interference and higher flexibility, and also permits greater accuracy at lower cost, a few problems may still arise with the programmable gain control. If, by way of example, both gain control blocks with 1-dB stages and gain control blocks with 6-dB stages are used in baseband of the receiver, then offsets may arise for the gain, particularly when the gain changes from one block to the other. In addition, it is a complex matter to ensure exactly 20 dB of gain in the receiver's LNA regardless of the frequency range which is set, the temperature and process tolerances.

In the transmission chain, the radio-frequency part normally contains a gain block with 6-dB stages, whereas baseband contains 1-dB stages. In this case too, problems may arise with the accuracy of the 6-dB amplifier stages with respect to process fluctuations, temperature dependencies and frequency changes. The accuracy problems described arise particularly when changing from one block to another. By way of example, when changing a gain of 5 dB, which is provided using an amplifier with a step size of 1 dB, to a gain of 6 dB, which is provided in an amplifier with a step size of 6 dB, the accuracy problems described may arise.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

The present invention is directed to an amplifier arrangement which is suitable for use in transmission arrangements and reception arrangements for continuous-time data transmission and which affords the advantages of programmable gain control without the accuracy problems described when changing the gain setting from one block to another block. The invention is also directed to a method for calibrating an amplifier arrangement.

In one embodiment of the present invention, the amplifier arrangement comprises a first programmable amplifier with an input, an output and a programming input for setting the gain, and a second programmable amplifier with an input coupled to the output of the first programmable amplifier, an output and a programming input for setting the gain. The first and second programmable amplifiers are programmable with a different amplifier step size. The amplifier arrangement further comprises a calibration path which couples the output of the second programmable amplifier to the programming input of the first or second programmable amplifier and which comprises an analog/digital converter and an evaluation and control element.

In accordance with another embodiment of the present invention, at least two series-connected programmable amplifiers are provided which each have a programming input configured to program the desired gain by applying a suitable digital word thereto. The first and second amplifiers have different amplifier step sizes, wherein the gain of the first amplifier can be programmed in steps of 1 dB and that of the second amplifier can be programmed in steps of 6 dB, for example. In addition, a calibration path is provided which couples the output of the programmable amplifier connected downstream in the signal path to the programming input of the first or second programmable amplifier. The calibration path comprises an analog/digital converter which provides a digital signal on the basis of an output signal level at the output of the second amplifier. In addition, the analog/digital converter has an evaluation and control element connected downstream thereto which is coupled to the programming input of the first and/or second programmable amplifier in order to calibrate the amplifier arrangement.

To tune the two programmable amplifiers, the present invention may easily be used to set a gain of 6 dB, for example, in the first programmable amplifier, which can be adjusted in steps of 1 dB, for example. While feeding in a defined reference signal, the power at the output is subjected to analog/digital conversion and is recorded. Next, the first programmable amplifier is reset and a gain of 6 dB is likewise turned on in the second programmable amplifier, which can likewise be set in steps of 6 dB, for example. In this case too, the reference signal is fed into the amplifier arrangement on the input side and the level at the output is again converted to a digital signal and recorded. The two measured values are then compared with one another, and the comparison is used to tune the amplifier arrangement by virtue of the first or the second amplifier, for example, having means which have a small amplifier step size of 0.1 dB, for example.

It is thus advantageously and easily possible to compensate for any inaccuracies arising when changing from one amplifier stage to another. These may be caused by production tolerances, temperature effects or frequency dependencies, for example.

In another embodiment of the invention, a level detector is connected between the output of the second programmable amplifier and the input of the analog/digital converter. By way of example, the level detector is configured to provide a voltage which is proportional to a power level applied to its input.

The level detector provided may, for example, be an RSSI (Received Signal Strength Indicator) circuit that outputs a signal on the basis of the reception field strength supplied at an antenna.

The evaluation and control element, in one example, is a microcontroller.

The evaluation and control element, in one example, comprises a memory for storing measurement results within the context of calibration.

Alternatively or additionally, a memory for storing a calibration word may be provided.

In another example, between the first and second programmable amplifier a low-pass filter is provided.

In yet another example, to generate a test signal for calibration, a test signal generator is provided which is coupled to the input of the amplifier arrangement, that is to say to the input of the first programmable amplifier.

The amplifier arrangement may also comprise more than two programmable amplifiers, and such variations are contemplated by the present invention.

When the amplifier arrangement is used in a transmission arrangement or in a reception arrangement, at least one respective programmable amplifier is preferably provided in baseband and in the radio-frequency path of the signal processing chain. However, a plurality of programmable amplifiers may also be provided in the baseband part and/or in the radio-frequency part.

The calibration path may be provided just in the baseband part or in the radio-frequency part particularly in the case of transmission arrangements, however, it may also be advantageous to feed back the calibration path from the output of the radio-frequency amplifier to a programming input of a programmable amplifier in baseband.

The amplifier arrangement described is particularly suitable for use in a transmission arrangement and/or reception arrangement for continuous-time data transmission. In particular, the amplifier arrangement is also suitable both for use in the reception path and for use in the transmission path of a transceiver for mobile radio.

The present invention, in one embodiment, combines the advantages of programmable gain control (PGC), such as low power consumption, small chip area, small number of pins, high level of robustness toward interference, high flexibility, high accuracy, low costs and simple implementation in CMOS production technology, with the opportunity to calibrate away inaccuracies when changing from one gain block to another.

When a programmable gain control is being used, advantageously no digital/analog converters are required in the baseband IC for gain control. There is thus also no need for reconstruction filters downstream of the D/A converter or output buffers which have to be able to drive the capacitance of a connection on the chip. The fact that all of these blocks may be dispensed with advantageously reduces the current drawn in the IC. Dispensing with said circuit blocks also permits a significant reduction in the chip area.

The programmable gain control may, in one example, be controlled using a "three-wire bus", which in some instances is already present on the chip for the purpose of controlling the phase locked loop. There is thus no need for any additional pin connections on the chip for the purpose of controlling the transmission power or the gain in the transmission arrangement, including the calibration thereof. In this context, the pin saving relates both to the baseband and to the radio-frequency part.

The fact that the programmable gain control uses a digital data format, in one example, means that it is very robust toward radiated interference.

In comparison to automatic gain control, the programmable gain control allows a higher level of flexibility for the choice of amplifier stages and for adjusting the time between the baseband gain control and the radio-frequency gain control. In addition, a large number of different baseband ICs can be combined with radio-frequency ICs from different manufacturers, which advantageously increases flexibility.

In CDMA systems, the reference variable for the gain control during transmitter power control in the baseband chip is generated on the basis of the measured reception power and the control bits which are received from the base station. In this case, the transmission power levels sent are specified in 1-dB steps with an accuracy of +/−0.5 dB. The fact that the present invention does not involve the digital signal processing being abandoned means that the gain control described is insensitive toward noise on the board, substrate noise associated with the D/A converters, gain tolerances in the automatic gain control with respect to temperature fluctuations, supply voltage fluctuations and process tolerances. In addition, a programmable gain control results in more simple matching between the inphase and quadrature signal components in baseband as compared to automatic gain control. Furthermore, the programmable gain control makes it easier to implement accurate 6-dB or 1-dB steps with respect to the gain in the radio-frequency range.

Reducing the chip area, reducing the number of pins, reducing the power consumption and increasing the robustness of the circuit naturally also reduce the manufacturing costs.

In addition, a programmable gain control is better suited to complete integration in a pure CMOS production method than an automatic gain control.

The invention is also directed to a method for calibrating an amplifier arrangement which comprises two series-connected amplifiers which can be programmed using different discrete step sizes. The method comprises programming a first predetermined gain factor by programming one of the two amplifiers, feeding a test signal into the amplifier arrangement, and measuring the actual output level of the amplifier arrangement. A second predetermined gain factor is then programmed by programming the other of the two amplifiers, a test signal is fed into the amplifier arrangement, and the output level of the amplifier arrangement is measured. The gain of the amplifier arrangement is then calibrated on the basis of the results of the measurements.

In accordance with the present invention, one of the two amplifiers is first of all programmed with a particular gain factor. The other amplifier is then switched to an output state for amplification. The amplifier arrangement programmed in this manner has a test signal applied to it, and the actual output level of the amplifier arrangement is then measured. After that, the other of the two amplifiers is programmed with a predetermined gain factor, while the amplifier programmed first is put into an output state. Again, the amplifier arrangement has a test signal applied to it and the output level is measured. The difference between the output levels is used to draw conclusions about any inaccuracies in the amplifier stages of the amplifiers. Appropriate calibration is performed by programming one of the two amplifiers or a further amplifier in the amplifier arrangement such that this offset in the gain is minimized or eliminated.

The present invention does not absolutely necessitate the first and second amplifiers being programmed with exactly the same, predetermined gain factor for the two measurements. The first predetermined gain factor and the second predetermined gain factor may also be different. In this case, any discrepancy in the gain can be interpolated. It is merely necessary to ensure that it is possible to draw conclusions about any inaccuracies there may be in the gain such that the amplifier arrangement can be calibrated.

BRIEF DESCRIPTION OF THE DRAWINGS

The invention is explained in more detail below using exemplary embodiments with reference to the drawings, in which.

DETAILED DESCRIPTION OF THE INVENTION

Figure 1:
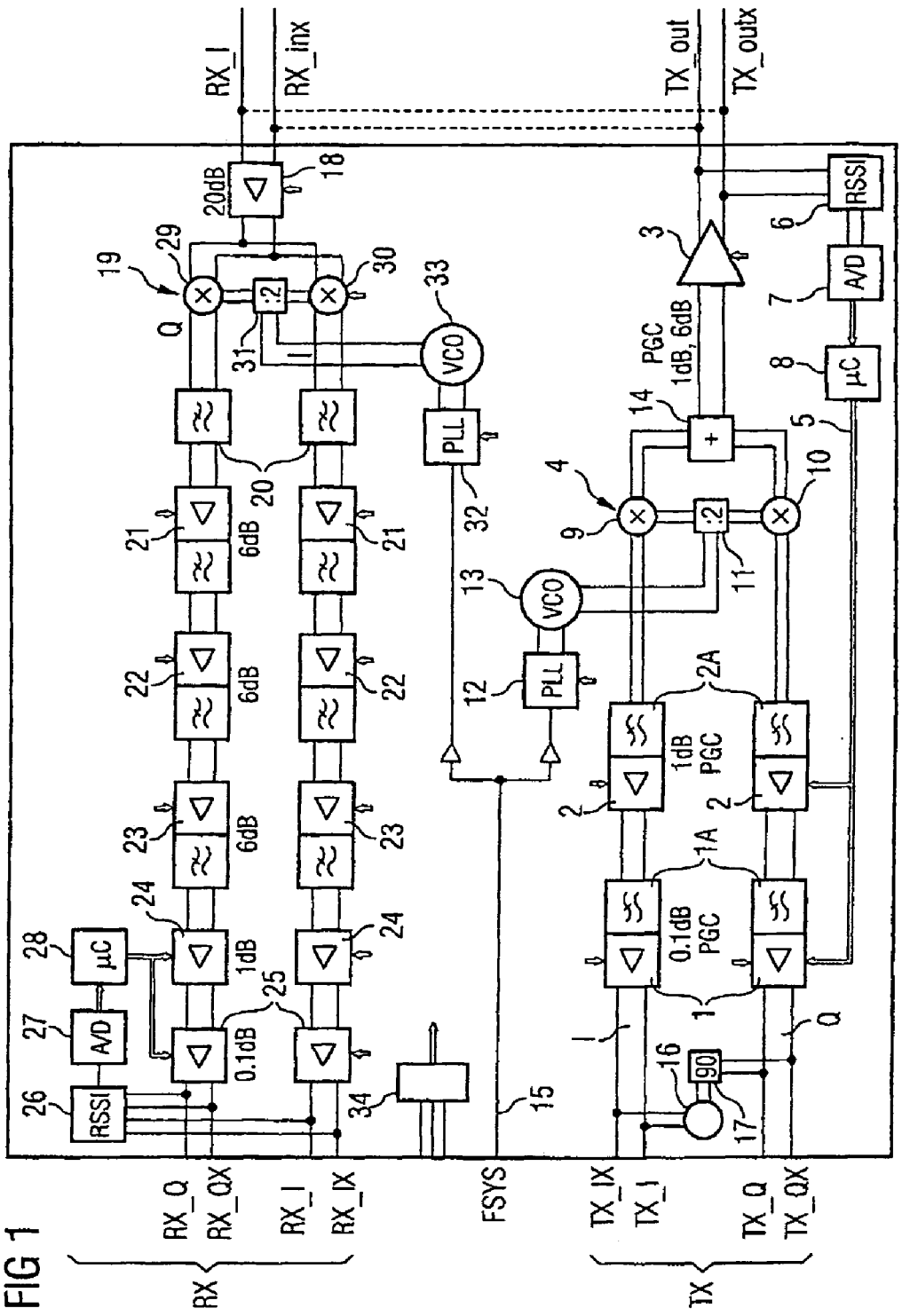
FIG. 1 shows a block diagram of an exemplary embodiment of an amplifier arrangement according to the present invention in the transmission path and in the reception path of a transceiver.

FIG. 1 shows an amplifier arrangement 1, 2, 3, 5 in accordance with the present invention both in the transmission path Tx and in the reception path Rx of a mobile radio transceiver. In the transmission path Tx, the amplifier arrangement 1, 2, 3, 5 comprises a programmable amplifier 1, a programmable amplifier 2 and a programmable amplifier 3. The programmable amplifier 1 is provided both in the inphase path I and in the quadrature path Q of the baseband signal processing chain. On the output side, the programmable amplifier 1 comprises a respective low-pass filter 1A. The programmable amplifier 1 has a further programmable amplifier 2 arranged downstream of it, likewise respectively split into the inphase and quadrature paths I, Q.

The programmable amplifier 2 likewise comprises a respective low-pass filter 2A on the output side. The outputs of the programmable amplifiers 2 have an upward frequency converter 4 connected to them which results in frequency conversion from baseband to a radio frequency. At the output of the frequency converter 4 there is a programmable amplifier 3 whose output forms the output of the amplifier arrangement 1, 2, 3, 5.

The amplifier arrangement 1, 2, 3, 5 also comprises a calibration path 5 which couples the output of the programmable amplifier 3 to programming inputs of the programmable amplifiers 1 and of the programmable amplifiers 2. The calibration path comprises, as a level detector, a means for outputting a reception-field strength indicator signal 6 whose input is connected to the output of the programmable amplifier 3. The output of the means for outputting a reception field indicator signal 6 is coupled to a microcontroller 8 via an analog/digital converter 7. In turn, the output of the microcontroller 8 is connected to the programming inputs of the programmable amplifiers 1, 2.

The frequency converter 4 comprises two frequency mixers 9, 10 whose first inputs are respectively connected to outputs of the programmable amplifiers 2. Second inputs of the frequency mixers 9, 10 are coupled to the output of a phase locked loop 12 with an oscillator 13 via a frequency and phase divider 11. The outputs of the frequency mixers 9, 10 are connected to the input of the programmable amplifier 3 via an adding element 14. The input of the phase locked loop 12 is connected to a reference frequency input 15 of the transceiver circuit Rx, Tx. The entire signal processing chain in the transmission path Tx is respectively designed using symmetrical circuitry in the baseband path and in the radio-frequency path and is designed to carry difference signals. In addition, a test signal generator 16 is coupled to the inputs of the first programmable amplifiers 1. The test signal generator 16 is connected to the programmable amplifier 1 in the inphase path I directly, whereas it is connected to the programmable amplifier 1 in the quadrature path Q via a 90° phase shifter 17.

The programmable amplifiers 1 can be programmed in steps of 0.1 dB. The programmable amplifiers 2 can be programmed in steps of 1 dB. The programmable amplifier 3 can be programmed in steps of either 1 dB or 6 dB.

In addition to the described amplifier arrangement 1, 2, 3, 5 based on the proposed principle in the transmission path Tx, a further amplifier arrangement 18, 21, 22, 23, 24, 25, 26, 27, 28 in accordance with the present invention is provided in the reception path Rx. A programmable amplifier 18 is designed as a low-noise preamplifier (LNA, Low-Noise Amplifier) and forms the input of the reception signal change shown. The output of the programmable amplifier 18 is connected to a downward frequency converter 19. The downward frequency converter 19 has an inphase output and a quadrature output. Connected to these outputs via a respective low-pass filter 20 in the inphase and quadrature paths I, Q is a respective amplifier chain comprising a programmable amplifier 21, a programmable amplifier 22, a programmable amplifier 23, a programmable amplifier 24 and a programmable amplifier 25.

There is also a calibration path 26, 27, 28 which couples the outputs of the programmable amplifiers 25 to respective programming inputs of the programmable amplifiers 24, 25. In a similar manner to the calibration path 5, the calibration path comprises a level detector 26, which is designed as a reception-field strength indicator, with a downstream analog/digital converter 27 and a microcontroller 28. The output side of the programmable amplifiers 21, 22, 23 has a respective low-pass filter. Whereas the programmable amplifier 18 can be programmed in a stage of 20 dB, the programmable amplifiers 21 to 23 can be programmed in steps of 6 dB. The programmable amplifiers 24 have a step size of 1 dB. The programmable amplifiers 25 have a step size of 0.1 dB.

The downward frequency converter 19 is designed for frequency conversion of a radio frequency to baseband and, to this end, comprises two frequency mixers 29, 30 whose first inputs are connected to the output of the programmable amplifier 18. Further inputs of the frequency mixers 29, 30 are coupled to a phase locked loop 32 with a voltage-controlled oscillator 33 via a frequency and phase divider 31. The phase locked loop 32 is connected to the reference frequency input 15 for the purpose of supplying a reference frequency. To provide a reference variable for the gain control with the programmable amplifiers, a three-wire bus interface 34 is provided in the transceiver shown in FIG. 1, said three-wire bus interface being coupled to the gain control loops 1, 2, 3, 5; 18, 21, 22, 23, 24, 25, 26, 27, 28 in the transmission and reception paths Tx, Rx.

The gain control loops described in FIG. 1 allow self-calibration of the PGC in baseband and radio-frequency parts. This allows highly accurate coverage of a wide dynamic range of far beyond 60 dB. In addition, good carrier frequency suppression can also be provided in the radio-frequency part on account of the gain control. Any inaccuracies in the tuning between the individual gain control blocks can easily be substantially reduced or eliminated through calibration.

In summary, the invention is directed to self-calibration of inaccuracies in programmable amplifiers in the radio-frequency part through fine tuning in baseband using a gain control loop with PGC (programmable Gain Control). The inaccuracy in the gain may be caused, by way of example, by the relatively large gain step of 20 dB in the low noise amplifier 18 in the receiver Rx or by the IQ modulator 4 in the transmitter.

In addition, the present invention provides for self-calibration of a combination of two different amplifier stages, for example an amplifier with a step size of 6 dB in combination with an amplifier with a step size of 1 dB. These two amplifiers may either both be provided in the radio-frequency part, may both be provided in baseband or may be provided in a form distributed over the radio-frequency part and baseband, and both in the receiver and in the transmitter.

Figure 2:
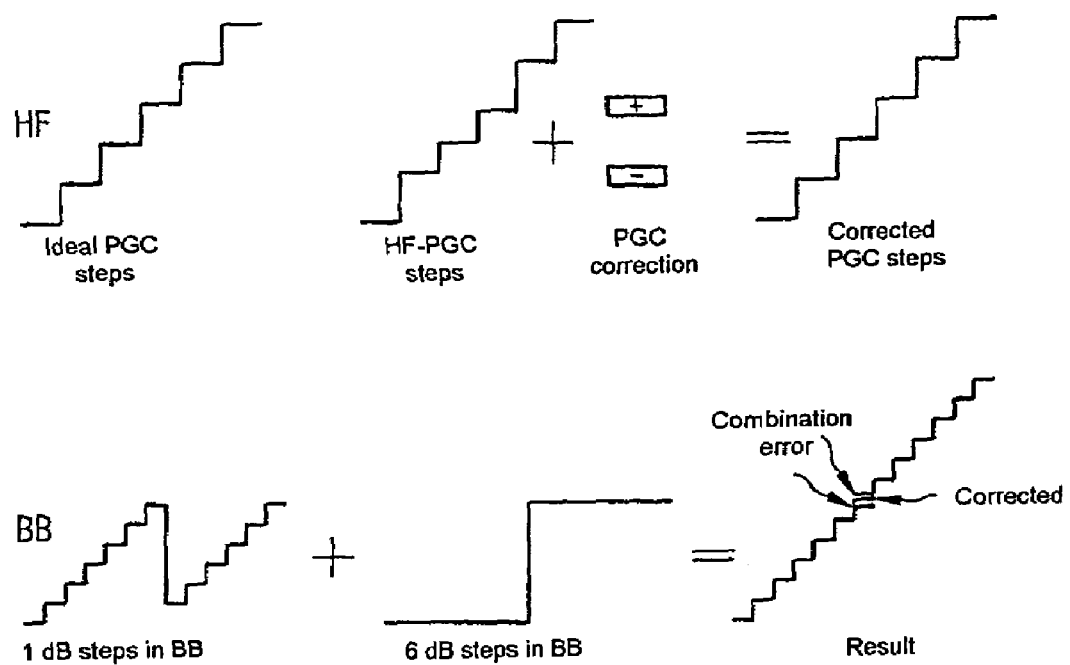
FIG. 2 illustrates the way in which the calibration of the amplifier step size works in accordance with the present invention.

FIG. 2 uses exemplary illustrations to show the calibration of programmable amplifiers according to the present invention, in the top half of the figure using an example of a radio-frequency path and in the bottom half of the figure using an example of a baseband signal path. The top left shows the ideal step size for a programmable amplifier in the radio-frequency part of a radio transmitter with programmable gain. To the right of that, the actual step size of a programmable amplifier in the radio-frequency part is indicated by way of example. The less-than-ideal characteristics of the step size, which are shown to an excessive degree, may arise, by way of example, when different programmable amplifiers or amplifiers with different step sizes clash at changeover points, for example at the changeover point from the step size 5×1 dB to the step size 1×6 dB. If this real PGC step size is corrected in baseband through appropriate calibration, as in the present invention, then a practically ideal curve is obtained with amplifier step sizes of equal magnitude, as shown at the far right.

A further example is shown in the bottom half of FIG. 2. There, an amplifier with a step size of 1 dB in baseband is combined with an amplifier with a step size of 6 dB, likewise in baseband. At the changeover point from one amplifier to the other, combination errors arise which can easily be calibrated away using the present invention.

Figure 3:
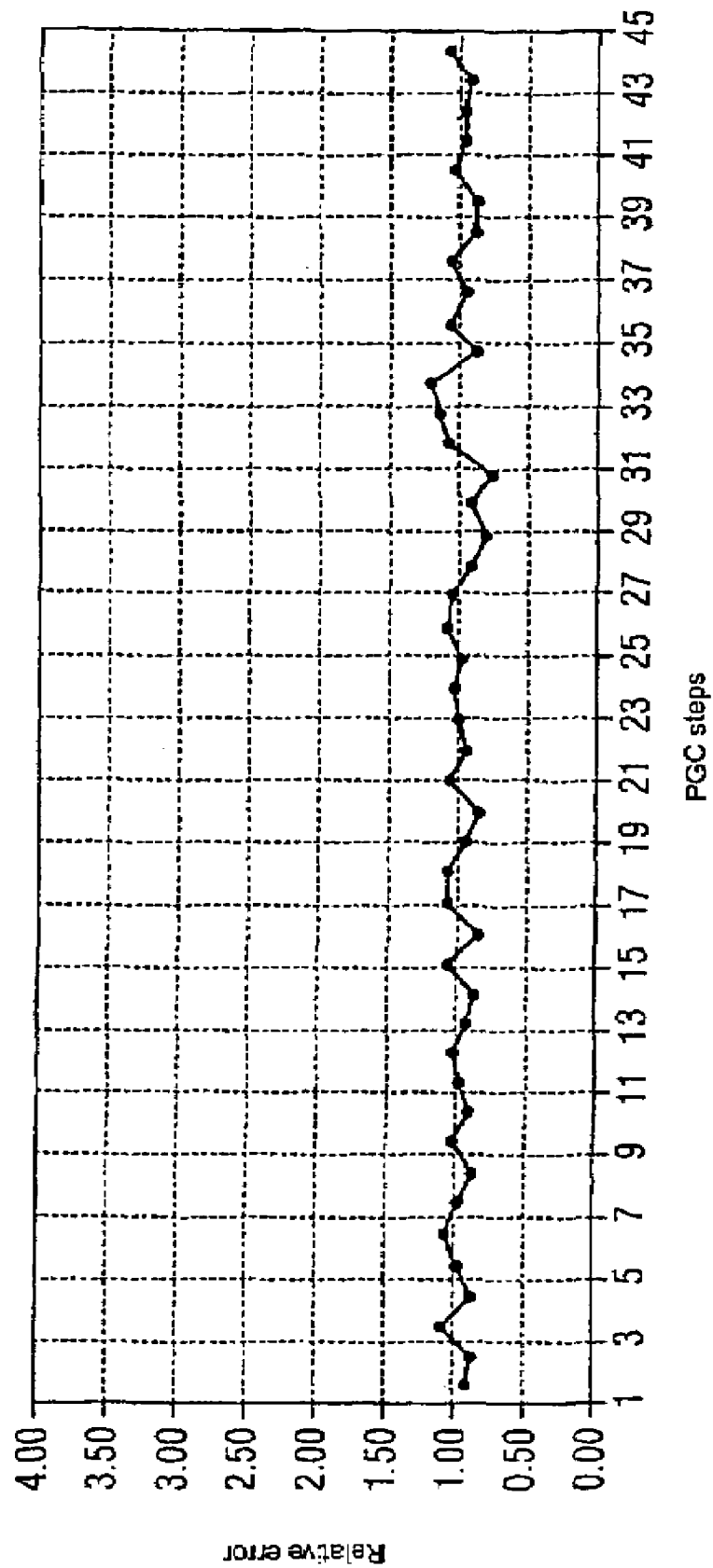
FIG. 3 is a graph illustrating exemplary relative errors in relation to the number of PGC steps in an amplifier arrangement according to the present invention.

FIG. 3 is a diagram that illustrates the relative errors plotted over the change in the step size of the programmable gain, using the example of 0 to 45 dB with a respective step size of 1 dB. It is possible to see that following performance of the calibration the relative error has a very smooth, homogeneous profile for combined PGC step sizes of 1-dB and 6-dB steps.

Figure 4:
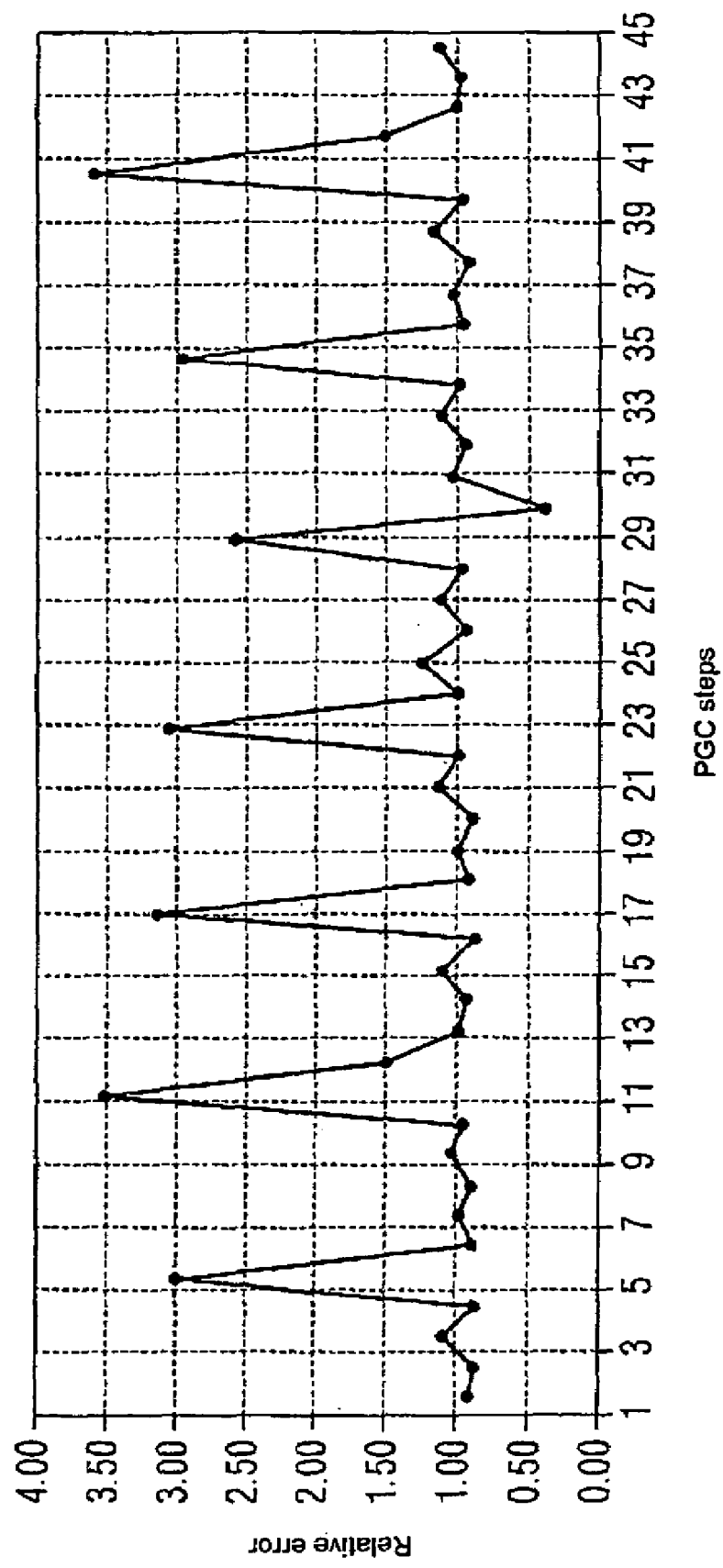
FIG. 4 illustrates the relative errors plotted against the number of PGC steps in the case of a programmable gain control arrangement based on the prior art.

By contrast, FIG. 4 is a curve that illustrates the relative errors over the PGC step size in steps of 1 dB, likewise from 1 to 45 dB, without calibration. In this case too, the programmable gain is made up of steps of step size 1 dB and 6 dB, which are generated using different amplifier stages. It is possible to see that large relative errors may arise particularly when transferring from 5 dB in single steps of 1 dB to a step size of 6 dB and back to 6+1 dB without calibration.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

The invention claimed is:

1. An amplifier arrangement, comprising:
    a first programmable amplifier comprising an input, an output, and a programming input for setting a gain associated therewith;
    a second programmable amplifier comprising an input coupled to the output of the first programmable amplifier, an output, and a programming input for setting a gain associated therewith, wherein the first and second programmable amplifiers are configured to be programmable with a different amplifier gain step size; and
    a calibration path coupled between the output of the second programmable amplifier and the programming input of the first and second programmable amplifiers, wherein the calibration path comprises a signal strength level detector connected to the output of the second programmable amplifier, an analog/digital converter coupled to an output of the signal strength level detector, and an evaluation and control element coupled to an output of the analog/digital converter,
    wherein the signal strength level detector is configured to output an analog signal that is a function of a signal power at the output of the second programmable amplifier, wherein the analog/digital converter is configured to convert the analog signal to a digital word, and wherein the evaluation and control element is configured to output a control signal to the programming inputs of the first and second programmable amplifiers to set the gains thereof based on the digital word.

2. The amplifier arrangement of claim 1, wherein the evaluation and control element is further configured to set the gain of the first programmable amplifier to a first predetermined gain level and evaluate the output of the second programmable amplifier in a calibration mode, set the gain of the second programmable amplifier to a second predetermined gain level and evaluate the output of the second programmable amplifier in the calibration mode, and set the gains thereof based on the evaluations for an operation mode.

3. The amplifier arrangement of claim 2, wherein the first predetermined gain level and the second predetermined gain level are the same.

4. The amplifier arrangement of claim 1, wherein the signal strength level detector is configured to output a reception-field strength indicator signal (RSSI) to the analog/digital converter based on the output of the second programmable amplifier.

5. The amplifier arrangement of claim 1, wherein the evaluation and control element comprises a microcontroller.

6. The amplifier arrangement of claim 1, further comprising a low-pass filter connected between the output of the first programmable amplifier and the input of the second programmable amplifier.

7. The amplifier arrangement of claim 1, further comprising a test signal generator coupled to the input of the first programmable amplifier, and configured to input a test signal thereto for calibration of the amplifier arrangement.

8. The amplifier arrangement of claim 1, further comprising a third programmable amplifier comprising a programming input for setting the gain thereof connected upstream of the first programmable amplifier.

9. The amplifier arrangement of claim 8, wherein the programming input of the third programmable amplifier is coupled to an output of the evaluation and control element in the calibration path.

10. The amplifier arrangement of claim 8, wherein the first programmable amplifier is configured to be programmed with a step size of 1 dB, the second programmable amplifier is configured to be programmed with a step size of 6 dB, and the third programmable amplifier is configured to be programmed with a step size of 0.1 dB.

11. The amplifier arrangement of claim 1, further comprising a frequency converter connected between the output of the first programmable amplifier and the input of the second programmable amplifier.

12. A mobile radio transceiver having reception and transmission paths, wherein at least one of the reception and transmission paths comprises an amplifier arrangement, comprising:
    a first programmable amplifier having a first gain adjustment step size, and comprising an input, a programming input, and an output;
    a second programmable amplifier having a second gain adjustment step size that is different than the first gain adjustment step size, and comprising an input, a programming input, and an output; and
    a calibration system coupled between the output of the second programmable amplifier and the programming inputs of the first and second programmable amplifiers, wherein the calibration system is configured to tune a gain of one or more of the first and second programmable amplifiers at the programming inputs thereof to minimize gain inaccuracies therebetween.

13. The mobile radio transceiver of claim 12, wherein the calibration system comprises:
    a level detector configured to receive the output of the second programmable amplifier and output a signal in response thereto; and
    a controller configured to measure the gains of the first and second programmable amplifiers from the level detector signal based on a reference input signal applied to the first and second programmable amplifiers, and further configured to program the gains of the first and second programmable amplifiers with a gain programming signal at the programming inputs thereof in response to the measured gains.

14. The mobile radio transceiver of claim 13, wherein the controller is further configured to measure a gain of the first programmable amplifier when set to a first predetermined gain value, and measure a gain of the second programmable amplifier when set to a second predetermined gain value, and provide a gain programming signal to each of the first and second programmable amplifiers based on a relationship between the measured gains.

15. The mobile radio transceiver of claim 14, wherein the first and second predetermined gain values are the same.

16. The mobile radio transceiver of claim 14, wherein the first gain adjustment step size is 1 dB, and the second gain adjustment step size is 6 dB, and wherein the first predetermined gain value and the second predetermined gain value is 6 dB.

17. A method for calibrating an amplifier arrangement which comprises two series-connected amplifiers configured to be programmed using different discrete gain step sizes, comprising:

programming one of the two amplifiers with a first predetermined gain factor;

feeding a test signal into the amplifier arrangement and measuring an actual output level thereof based on the programming with the first predetermined gain factor;

programming the other of the two amplifiers with a second predetermined gain factor;

feeding a test signal into the amplifier arrangement and measuring the output level thereof based on the programming with the second predetermined gain factor; and calibrating a gain of the amplifier arrangement based on the measurement results.

18. The method of claim 17, wherein the first predetermined gain factor and the second predetermined gain factor are the same, and wherein calibrating comprises altering the gain of the amplifier arrangement so that the two measurements match or have a minimized discrepancy between one another.

19. The method of claim 18, wherein the gain of the amplifier arrangement is calibrated by programming the gain of one of the two amplifiers.

20. The method of claim 18, wherein the gain of the amplifier arrangement is calibrated by programming the gain of a third amplifier in series with the two series-connected amplifiers.

* * * * *